United States Patent [19]

Yukawa

[11] Patent Number: 5,559,356

[45] Date of Patent: Sep. 24, 1996

[54] SEMICONDUCTOR DEVICE WITH LARGE SUBSTRATE CONTACT REGION

[75] Inventor: Akira Yukawa, Tokyo, Japan

[73] Assignee: NEC Corporation, Japan

[21] Appl. No.: 543,285

[22] Filed: Oct. 16, 1995

[30] Foreign Application Priority Data

Oct. 17, 1994 [JP] Japan .................................. 6-250853

[51] Int. Cl.$^6$ ............................ H01L 29/76; H01L 29/94
[52] U.S. Cl. ......................... 257/371; 257/369; 257/370; 257/372
[58] Field of Search .................................. 257/368, 369, 257/376, 370, 371, 659, 372

[56] References Cited

U.S. PATENT DOCUMENTS 5,281,842  1/1994  Yasuda et al. .......................... 257/371

*Primary Examiner*—Mahshid Saadat
*Assistant Examiner*—Valencia Martin Wallace
*Attorney, Agent, or Firm*—Hayes, Soloway, Hennessey, Grossman & Hage, P.C.

[57]  ABSTRACT

In a MOS-type semiconductor device having a semiconductor substrate, a drain region, a source region, and a gate electrode between the drain region and the source region, a substrate contact region of a conductivity type the same as that of the semiconductor substrate is formed adjacent to the source region, and is wider than the source region and the drain region.

16 Claims, 5 Drawing Sheets 5,559,356

SEMICONDUCTOR DEVICE WITH LARGE SUBSTRATE CONTACT REGION

BACKGROUND OF THE INVENTION

1. Field of the Invention

The present invention relates to a metal oxide semiconductor (MOS)-type semiconductor device, and more particularly, to a low substrate noise MOS-type semiconductor device.

2. Description of the Related Art

In a complementary MOS analog/digital hybrid large scale integrated (LSI) device, digital circuits where voltages are fully swung and analog circuits where a very small voltage less than some mV is significant are mixed. Therefore, noise easily penetrates from the digital circuits via power supply lines and a substrate to the analog circuits.

The noise from the digital circuits via the power supply lines to the analog circuits can be reduced by providing individual power supply lines for the digital circuits and the analog circuits, an approach which has been broadly used.

On the other hand, the noise, so called substrate noise, from the digital circuits via the substrate to the analog circuits is generated from a 1-bit output delta-sigma modulator or a charge pump circuit of a phase locked loop (PLL) circuit. In a CMOS device, if an N-channel MOS transistor is formed in a P-type semiconductor substrate, a P-channel MOS transistor is formed in an N-type well. In this case, the back gate of the N-channel MOS transistor is the substrate and the back gate of the P-channel Mos transistor is the well. Since the well is separated from the substrate by a PN junction therebetween and an analog power supply voltage is applied to the well, the P-channel MOS transistor hardly suffers from the substrate noise. Conversely, the N-channel MOS transistor suffers directly from the substrate noise.

In a prior art semiconductor device, in order to suppress the substrate noise, an impurity diffusion region, i.e., a substrate contact region, of the same conductivity type as the substrate having a higher impurity concentration than the substrate is formed in the substrate to surround a transistor area. Also, the substrate contact region is connected to a definite power supply voltage line. Thus, the voltage in the substrate around the transistor area is brought close to the voltage at the power supply voltage line, thus reducing the substrate noise. This will be explained later in detail.

In the above-described prior art semiconductor device, however, the devices have become increased in size, thus increasing the substrate noise and reducing the impedance of noise sources, so that the power supply line connected to the substrate contact region per se suffers from the substrate noise. Also, this power supply line serves as a noise source for other transistor areas. Further, since individual power supply voltages are applied to the source region and the substrate contact region, noises superimposed onto the power supply voltages are added to a current of the transistor as a noise current Also, in the prior art semiconductor device, in order to increase the integration, the width of the substrate contact region is so reduced that the resistance of the substrate contact region and its neighborhood is increased. As a result, the resistance between the back gate and the substrate contact region is not so small as the resistance between the back gate and the substrate, and accordingly, the substrate noise can be reduced by the substrate contact region to only about ½.

Further, usually, a channel stopper region is provided to surround the substrate contact region, to thus avoid the creation of a parasitic MOS transistor. However, since the substrate contact region serves as a low impedance for noise transmitted via the channel stopper, the substrate noise cannot be further suppressed.

SUMMARY OF THE INVENTION

It is an object of the present invention to reduce the substrate noise in a MOS-type semiconductor device.

According to the present invention, in a MOS-type semiconductor device having a semiconductor substrate, a drain region, a source region, and a gate electrode between the drain region and the source region, a substrate contact region of a conductivity type the same as that of the semiconductor substrate is formed adjacent to the source region, and is wider than the source region and the drain region.

BRIEF DESCRIPTION OF THE DRAWINGS

The present invention will be more clearly understood from the description as set forth below, in comparison with the prior art, with reference to the accompanying drawings, wherein.

DESCRIPTION OF THE PREFERRED EMBODIMENT

Before the description of the preferred embodiment, a prior art semiconductor device will be explained with reference to FIG. 1 and FIG. 2 which is a cross-sectional view of FIG. 1.

Figure 1:
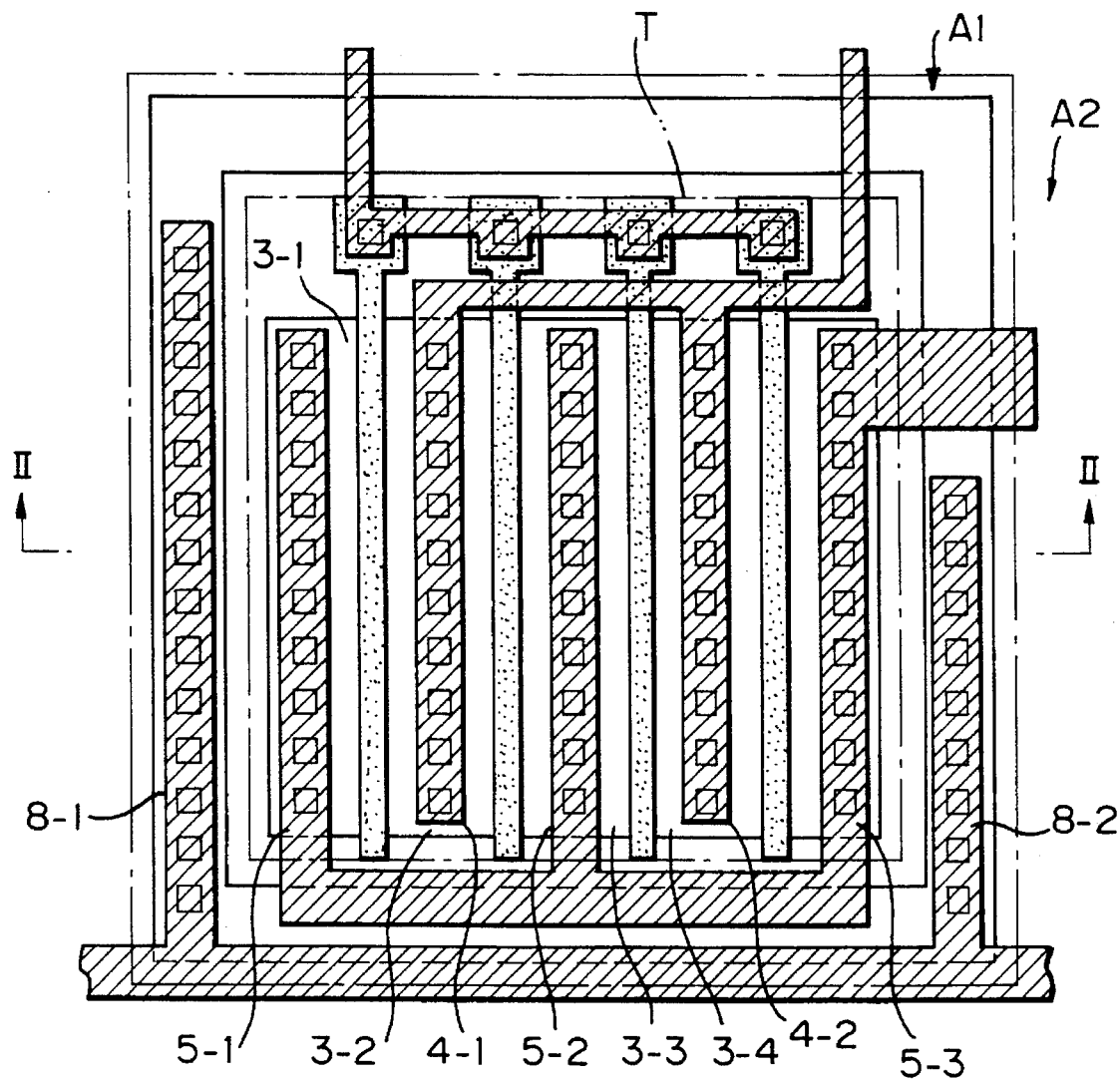
FIG. 1 is a layout diagram illustrating a prior art semiconductor device.
Figure 2:
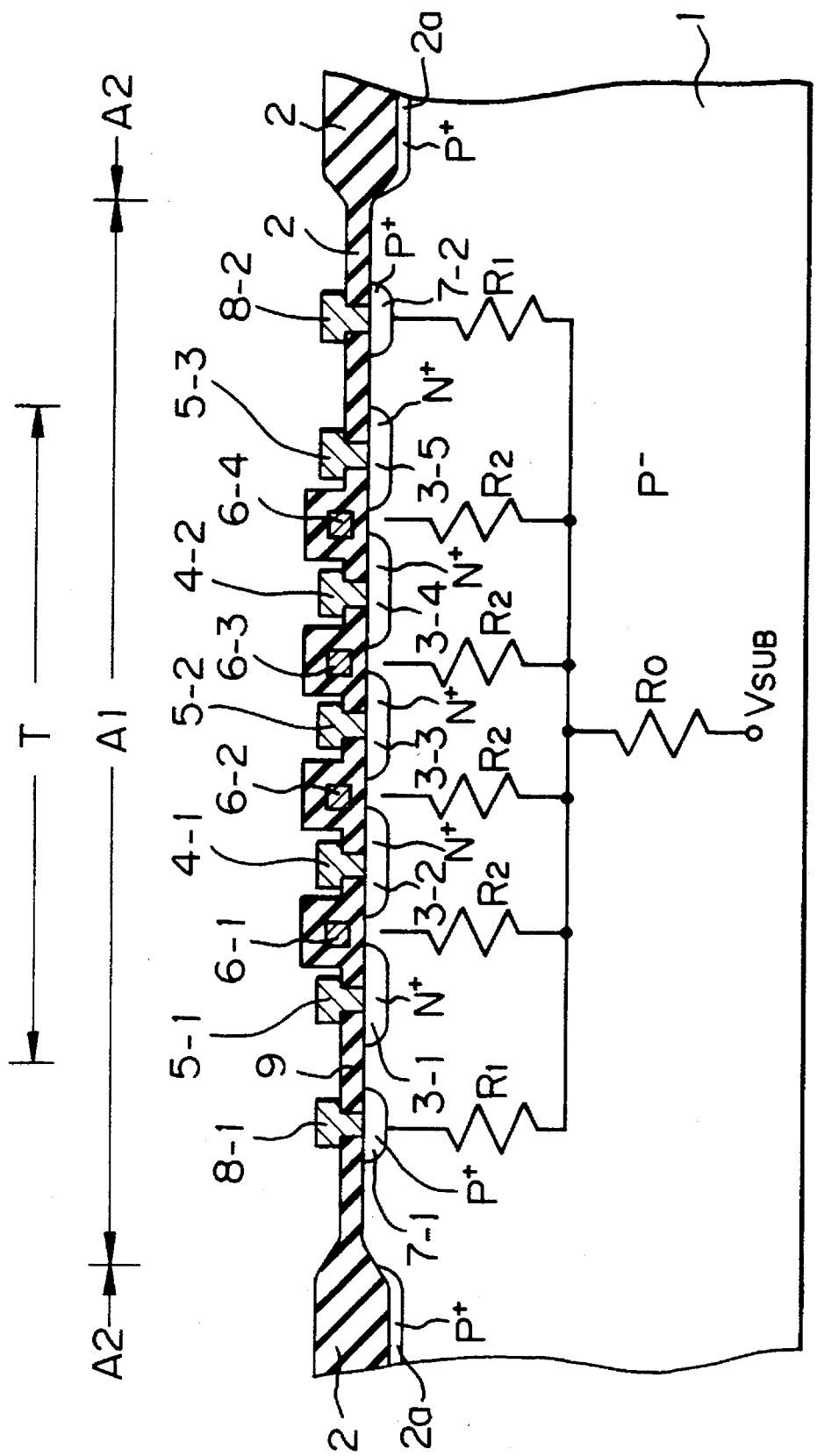
FIG. 2 is a cross-sectional view taken along the line II—II of FIG. 1.

In FIGS. 1 and 2, a relatively thick field silicon oxide layer 2 having a $P^+$-type channel stopper 2a therebeneath is formed on a P-type monocrystalline silicon substrate 1 to partition an active area A1 and a field area A2 to isolate the active area A1 from other active areas. Also, a transistor area T is defined within the active area A1.

In the transistor area T, $N^+$-type impurity diffusion regions 3-1 to 3-5 ara formed within the substrate 1. In this case, the regions 3-2 and 3-4 serve as drain regions, and the regions 3-1, 3-3 and 3-5 serve as source regions. Provided on the drain regions 3-2 and 3-4 are drain electrodes 4-1 and 4-2 which form a multi-finger type drain configuration. Also, provided on the source regions 3-1, 3-3 and 3-5 are source electrodes 5-1, 5-2 and 5-3 which form a multi-finger type source configuration. Further, provided between the drain regions 3-2 and 3-4 and the source regions 3-1, 3-3 and 3-5 are gate electrodes 6-1, 6-2, 6-3, 6-4 and 6-5 which form a multi-finger configuration.

Also, $P^+$-type substrate contact regions 7-1 and 7-2 are provided in the semiconductor substrate 1 to surround the transistor area T, i.e., the $N^+$-type impurity regions 3-1 to 3-5. Also, reference numerals 8-1 and 8-2 designate power supply lines for applying a definite voltage to the substrate contact regions 7-1 and 7-2. Further, reference numeral 9 designates an insulating layer made of silicon oxide.

In the semiconductor device as illustrated in FIGS. 1 and 2, however, when the device is increased in size, so as to increase the substrate noise and reduce the impedance of noise sources, the power supply lines 8-1 and 8-2 connected to the substrate contact regions 7-1 and 7-2 per se suffer from the substrate noise. Also, this power supply lines 8-1 and 8-2 serve as noise sources for other transistor areas. Further, since individual power supply voltages are applied to the sources regions 3-1, 3-3 and 3-5 and the substrate contact regions 7-1 and 7-2, noises superimposed onto the power supply voltages are added to a current of the transistor as a noise current.

Also, in FIGS. 1 and 2, in order to increase the integration, the width of the substrate contact region is so reduced that the resistance of the substrate contact regions 7-1 and 7-2 and its neighborhood is increased. As a result, the resistance $(R_1+R_2)$ between the back gate and the substrate contact region 8-1 (8-2) is not as small as the resistance $(R_0+R_2)$ between the back gate and the substrate. For example, the resistance $(R_1+R_2)$ is larger than hundreds of $\Omega$, and the resistance $(R_0+R_2)$ is hundreds of $\Omega$. In this case, if the resistance $R_0$ is approximately half of the resistance $R_1$, the substrate noise at the back gate can be represented by $$(V_{SUB})_{noise} \cdot (R_1/2)/(R_0+R_1/2) \approx (V_{SUB})_{noise}/2$$

where $(V_{SUB})_{noise}$ is the substrate noise. Therefore, the substrate noise at the back gate can be reduced by the substrate contact region to only about one half.

Further, usually, the channel stopper region 2a is provided to surround the substrate contact regions 7-1 and 7-2, to thus avoid the creation of a parasitic MOS transistor. However, since the substrate contact regions 7-1 and 7-2 serve as a low impedance for noise transmitted via the channel stopper 2a, the substrate noise cannot be further suppressed.

Figure 3:
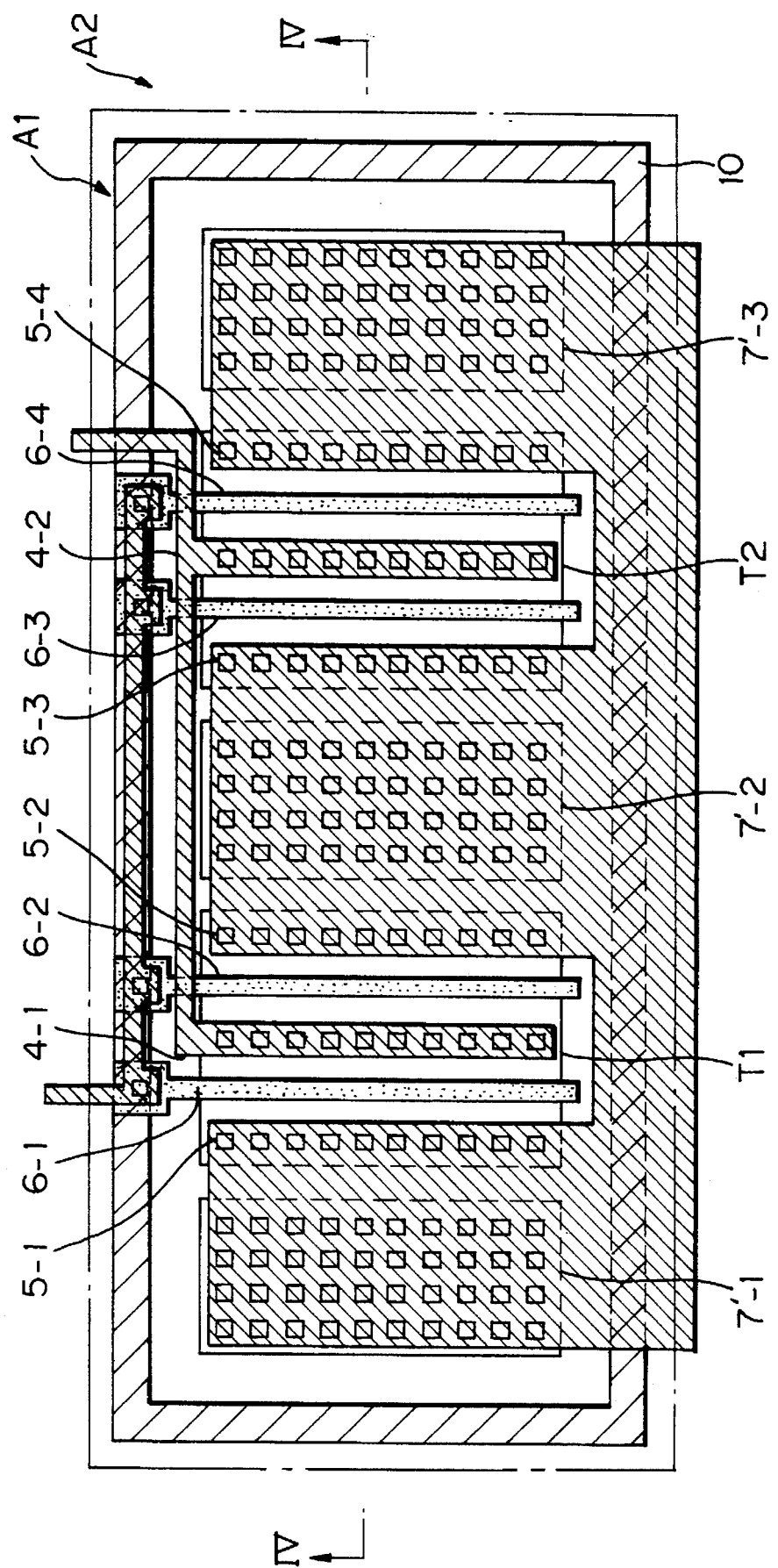
FIG. 3 is a layout diagram illustrating an embodiment of the semiconductor device according to the present invention.
Figure 4:
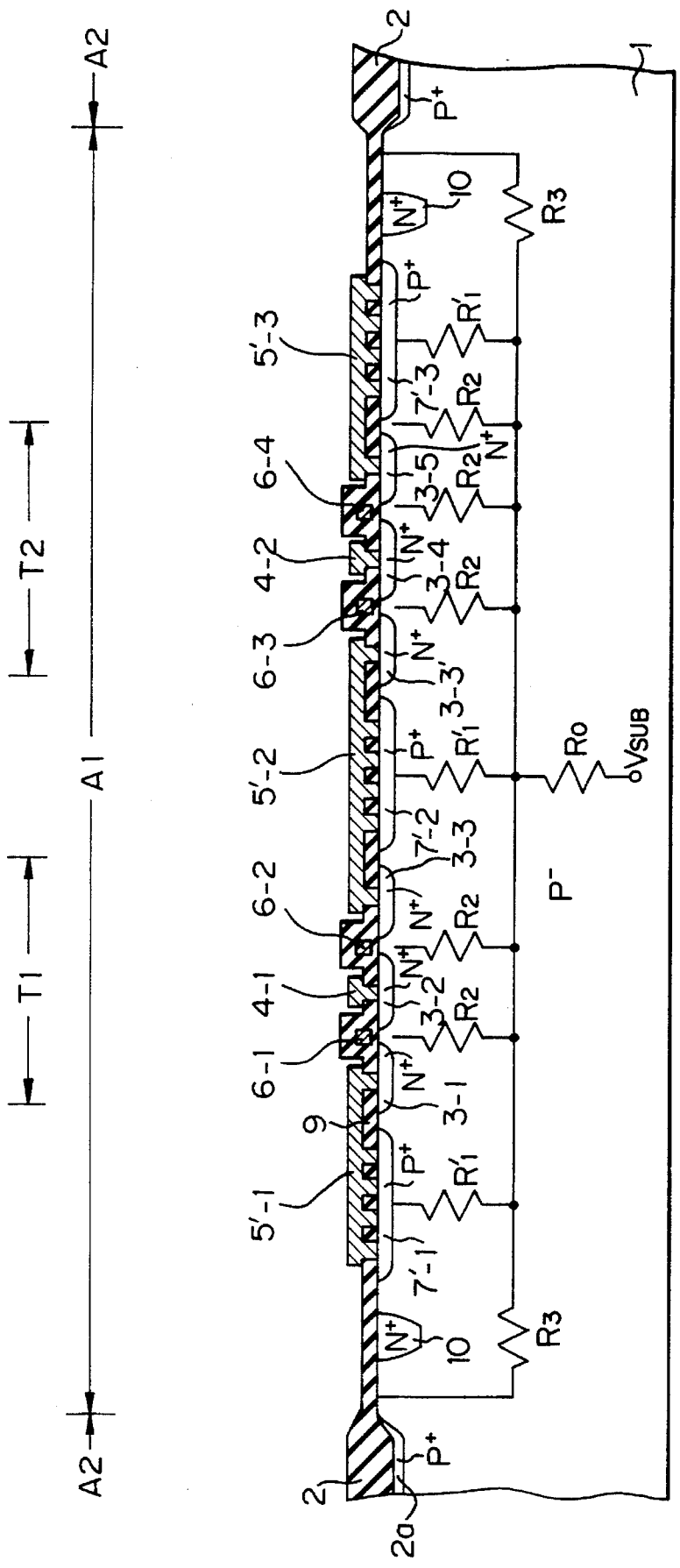
FIG. 4 is a cross-sectional view taken along the line IV—IV of FIG. 3.

FIGS. 3 and 4 illustrate an embodiment of the present invention. Note that FIG. 4 is a cross-sectional view taken along the line IV—IV of FIG. 3.

In FIGS. 3 and 4, two transistor areas T1 and T2 which are symmetrical to each other are provided, and each of the transistor areas T1 and T2 is divided into two portions which are symmetrical to each other. That is, each of the transistor areas T1 and T2 includes one drain region 3-2 (3-4) connected to the drain electrodes 4-1 (4-2), two source regions 3-1 and 3-3 (3-3' and 3-5), and two gate electrodes 6-1 and 6-2 (6-3 and 6-4).

Also, P$^+$-type substrate contact regions 7'-1, 7'-2 and 7'-3 are provided on sides of the transistor areas T1 and T2, i.e., adjacent to the source regions 3-1, 3-3, 3-3' and 3-5. The substrate contact regions 7'-1, 7'-2 and 7'-3 are wider than the substrate contact regions 7-1 and 7-2 of FIG. 2. For example, the width of each of the substrate contact regions 7'-1, 7'-2 and 7'-3 is larger than half of intervals thereof. Further, the substrate contact regions 7'-1, 7'-2 and 7'-3 are electrically connected to the source regions 3-1, 3-3 (3-3') and 3-5, respectively, by source electrodes 5'-1, 5'-2 and 5'-3.

Thus, the resistance $(R_1'+R_2)$ between the back gate and the substrate contact region 7'-1 (7'-2, 7'-3) can be reduced. For example, the resistance $R_1'$ can be reduced by about one tenth of the resistance $R_1$ of FIG. 2. In this case, $$(V_{SUB})_{noise} \cdot (R_1'/2)/(R_0+R_1'/2) \approx (V_{SUB})_{noise}/10$$

where $R_1' = \frac{1}{10} R_1$ and $R_1 = 2R_0$. Therefore, the substrate noise at the back gate can be reduced by about one tenth. Also, since the voltage at the source regions 3-1, 3-3, 3-3' and 3-5 is approximately close to the voltage at the substrate voltage $V_{sub}$, the power supply noise mainly depends upon the source noise, thus reducing a load of design.

Figure 5:
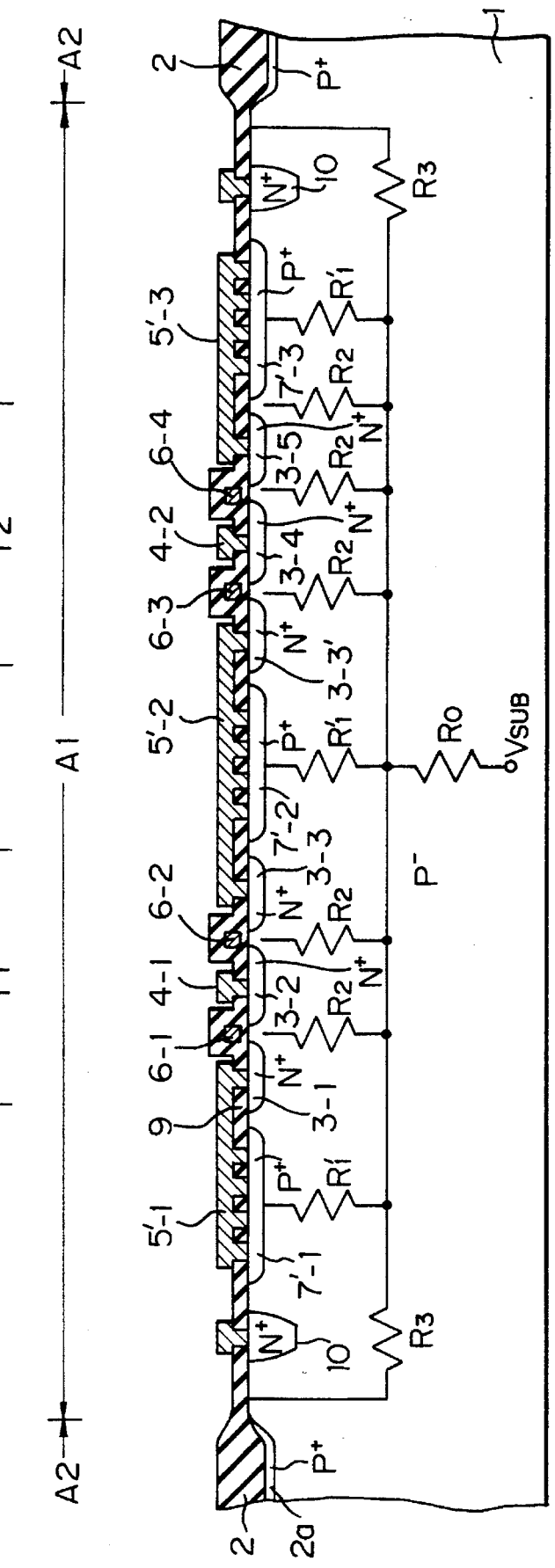
FIG. 5 is a cross-sectional view illustrating a modification of FIG. 4.

Also, in FIGS. 3 and 4, an N$^+$-type impurity region 10 is provided to surround the transistor areas T1 and T2. The N$^+$-type impurity region 10 is deeper than the drain source regions 3-1, 3-3, 3-3' and 3-5 and the drain regions 3-2 and 3-4. In this case, the N$^+$-type impurity region 10 is in a floating state; however, the N$^+$-type impurity region 10 can be connected to a definite power supply line via an electrode 11 as illustrated in FIG. 5. Therefore, the N$^+$-type impurity region 10 serves as a high impedance as indicated by $R_3$ for low frequency (less than hundreds of kHZ) noise transmitted via the channel stopper 2a, the substrate noise can be further reduced.

Although the above-described embodiment describes an N-channel MOS transistor, it goes without saying that the present invention can be applied to a P-channel MOS transistor.

As explained hereinbefore, according to the present invention, since wider substrate contact regions are provided, the resistance between a back gate and the substrate contact regions can be reduced, and accordingly, the substrate noise can be reduced.

I claim:

1. A semiconductor device comprising:

a semiconductor substrate of a first conductivity type;

a drain region of a second conductivity type opposite to said first conductivity type, formed in said semiconductor substrate;

a source region of said second conductivity type, formed in said semiconductor substrate;

a gate electrode, formed over said semiconductor substrate between said drain region and said source region;

a substrate contact region of said first conductivity type having a higher impurity concentration than said semiconductor substrate, said substrate contact region being formed in said semiconductor substrate adjacent to said source region;

a source electrode formed on said source region; and a drain electrode formed on said drain region, said substrate contact region being wider than said drain region and said source region.

2. A device as set forth in claim 1, wherein said source electrode is electrically connected to said substrate contact region.

3. A device as set forth in claim 1, further comprising an impurity diffusion region of said second conductivity type, being formed in said semiconductor substrate and surrounding said source region, said drain region and said substrate contact region.

4. A device as set forth in claim 3, wherein said impurity diffusion region is deeper than said source region, said drain region and said substrate contact region.

5. A device as set forth in claim 3, wherein said impurity diffusion region is connected to a definite power supply voltage line, so that a reverse bias voltage is applied between said impurity diffusion region and said semiconductor substrate.

6. A device as set forth in claim 3, wherein said impurity diffusion region is in a floating state.

7. A device as set forth in claim 3, further comprising a channel stopper region of said first conductivity type, being formed in said semiconductor substrate and surrounding said impurity diffusion region.

8. A semiconductor device comprising:

a semiconductor substrate of a first conductivity type;

a drain region of a second conductivity type opposite to said first conductivity type, formed in said semiconductor substrate;

a source region of said second conductivity type, formed in said semiconductor substrate;

a gate electrode, formed over said semiconductor substrate between said drain region and said source region;

a source electrode formed on said source region;

a drain electrode formed on said drain region; and an impurity diffusion region of said second conductivity type, being formed in said semiconductor substrate and surrounding said source region, said drain region and said substrate contact region.

9. A semiconductor device having a plurality of transistor areas for one MOS transistor, comprising:

a semiconductor substrate of a first conductivity type;

a plurality of drain regions of a second conductivity type opposite to said first conductivity type, each of said drain regions being formed in one of said transistor areas of said semiconductor substrate;

a plurality of source region pairs of said second conductivity type, each of said source region pairs being formed in one of said transistor areas of said semiconductor substrate and surrounding a respective one of said drain regions;

a plurality of gate electrode pairs each of said gate electrode pairs being formed over one of said transistor areas of said semiconductor substrate between a respective one of said drain regions and a respective one of said source region pairs;

a plurality of substrate contact regions of said first conductivity type having a higher impurity concentration than said semiconductor substrate, said substrate contact regions being formed in said semiconductor substrate adjacent to regions of said source region pairs, a source electrode formed on said source region pairs; and a drain electrode formed on said drain regions, the width of each of said substrate contact regions being larger than half of intervals of said substrate contact regions.

10. A device as set forth in claim 9, wherein said source electrode is connected to said substrate contact regions, said source region pairs and said substrate contact regions.

11. A device as set forth in claim 9, further comprising an impurity diffusion region of said second conductivity type, being formed in said semiconductor substrate and surrounding said transistor areas.

12. A device as set forth in claim 11, wherein said impurity diffusion region is deeper than said drain regions.

13. A device as set forth in claim 11, wherein said impurity diffusion region is connected to a definite power supply voltage line, so that a reverse bias voltage is applied between said impurity diffusion region and said semiconductor substrate.

14. A device as set forth in claim 11, wherein said impurity diffusion region is in a floating state.

15. A device as set forth in claim 11, further comprising a channel stopper region of said first conductivity type, being formed in said semiconductor substrate and surrounding said impurity diffusion region.

16. A semiconductor device having a plurality transistor areas for one MOS transistor, comprising:

a semiconductor substrate of a first conductivity type;

a plurality of drain regions of a second conductivity type opposite to said first conductivity type, each of said drain regions being formed in one of said transistor areas of said semiconductor substrate;

a plurality of source region pairs of said second conductivity type, each of said source region pairs being formed in one of said transistor areas of said semiconductor substrate and surrounding a respective one of said drain regions;

a plurality of gate electrode pairs, each of said gate electrode pairs being formed over one of said transistor areas of said semiconductor substrate between a respective one of said drain regions and a respective one of said source region pairs;

a plurality of substrate contact regions of said first conductivity type having a higher impurity concentration than said semiconductor substrate, said substrate contact regions being formed in said semiconductor substrate adjacent to regions of said source region pairs, a source electrode formed on said source region pairs;

a drain electrode formed on said drain regions; and an impurity diffusion region of said second conductivity type, being formed in said semiconductor substrate and surrounding said transistor areas.

* * * * *